US012015299B1

(12) United States Patent
Hussein et al.

(10) Patent No.: US 12,015,299 B1
(45) Date of Patent: *Jun. 18, 2024

(54) METHOD FOR RECHARGING A VEHICLE BATTERY

(71) Applicant: Prince Mohammad Bin Fahd University, Dhahran (SA)

(72) Inventors: Ala A. Hussein, Canton, MI (US); Abdulmajeed Al-Abdusalam, Dhahran (SA); Hasan Ali Alseni, Dhahran (SA); Meenhal Al-Najjar, Dhahran (SA); Hani Quraish, Dhahran (SA)

(73) Assignee: Prince Mohammad Bin Fahd University, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 18/581,431

(22) Filed: Feb. 20, 2024

Related U.S. Application Data

(63) Continuation of application No. 18/080,334, filed on Dec. 13, 2022.

(51) Int. Cl.
*H02J 7/00* (2006.01)
*G01R 27/08* (2006.01)
*H02M 7/5387* (2007.01)

(52) U.S. Cl.
CPC .......... *H02J 7/00712* (2020.01); *G01R 27/08* (2013.01); *H02J 7/0047* (2013.01); *H02M 7/53871* (2013.01)

(58) Field of Classification Search
CPC ..................................................... G01R 27/08
See application file for complete search history.

(56) References Cited

U.S. PATENT DOCUMENTS

2012/0268060 A1  10/2012  Chen
2015/0329007 A1  11/2015  Matsunaga et al.
(Continued)

OTHER PUBLICATIONS

L. R. Chen, et al., "Sinusoidal Ripple Current Charging System with PLL Function", IEEE 23rd International Symposium on Industrial Electronics (ISIE), Jun. 1-4, 2014, pp. 1836-1841.
(Continued)

*Primary Examiner* — Drew A Dunn
*Assistant Examiner* — Tynese V McDaniel
(74) *Attorney, Agent, or Firm* — Oblon, McClelland, Maier & Neustadt, L.L.P.

(57) ABSTRACT

A circuit for charging a rechargeable battery is described. The circuit includes a first DC voltage source, a bus capacitor $C_{bus}$, an H-bridge circuit, a rechargeable battery, a second DC voltage source, an impedance meter and a microcontroller. The impedance meter measures an impedance of the rechargeable battery. The microcontroller is connected to the impedance meter and to each gate contact. The microcontroller generates a set of drive signals that are configured to generate a sinusoidal with ripple current at an output terminal of the H-bridge circuit. The microcontroller adjusts a frequency of the sinusoidal with ripple current based on the impedance of the rechargeable battery and identifies a frequency of the sinusoidal with ripple current at which the rechargeable battery has a minimum internal impedance. The microcontroller adjusts the set of drive signals to generate the sinusoidal with ripple current at the identified frequency and recharge the rechargeable battery.

7 Claims, 11 Drawing Sheets

(56) References Cited

U.S. PATENT DOCUMENTS

| | | |
|---|---|---|
| 2016/0380437 A1 | 12/2016 | Casimir et al. |
| 2018/0287407 A1 | 10/2018 | Sayre |
| 2019/0198833 A1 | 6/2019 | Le et al. |
| 2020/0363476 A1 | 11/2020 | Liu et al. |
| 2023/0015814 A1 | 1/2023 | Zhang et al. |
| 2023/0139514 A1 | 5/2023 | Tennant |
| 2023/0216430 A1 | 7/2023 | Shibata et al. |

OTHER PUBLICATIONS

Liang-Rui Chen, et al., "Design of Sinusoidal Current Charger with Optimal Frequency Tracker for Li-ion Battery", The 2010 International Power Electronics Conference—ECCE Asia, Jun. 21-24, 2010, pp. 1484-1489.

Abdulmajeed Al-Abdusalam, et al., "Optimal Sinusoidal-with-Ripple Battery Charging System", Prince Mohammad Bin Fahd University, Department of Electrical Engineering, Apr. 21, 2021, 30 pages.

Liang-Rui Chen, et al., "Sinusoidal-Ripple-Current Charging Strategy and Optimal Charging Frequency Study for Li-Ion Batteries", IEEE Transactions on Industrial Electronics, vol. 60, No. 1, Jan. 26, 2012, pp. 88-97.

Marija Vujacic, et al., "Evaluation of DC Voltage Ripple in Single-Phase H-Bridge PWM Inverters", IECON 2016—42nd Annual Conference of the IEEE Industrial Electronics Society, Conference Paper, Dec. 2016, 6 pages.

METHOD FOR RECHARGING A VEHICLE BATTERY

CROSS-REFERENCE TO RELATED APPLICATIONS

The present application is a Continuation of U.S. application Ser. No. 18/080,334, pending, having a filing date of Dec. 13, 2022.

BACKGROUND

Technical Field

The present disclosure is directed to a system and methods for charging a rechargeable battery with a sinusoidal plus ripple current.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Demand and usage of electric vehicles and hybrid vehicles has increased all over the world because of a variety of factors including climate change, fossil fuel supply constraints, increasing fuel prices, greenhouse gas emissions, and resulting reduced air quality. Compared to traditional vehicles, electric vehicles have the advantages of zero emissions and no environmental pollution during their operation. In an electric vehicle, a rechargeable battery is mounted on the vehicle and is configured to be charged from a charging point. Common techniques for charging batteries, such as constant trickle current charge (CTC), constant current (CC), and constant current and constant voltage (CC-CV) are utilized. When the onboard rechargeable battery is charged from the charging point, the charging time depends on various factors, such as power output, waiting time, and different charger types. To reduce the charging time, the rechargeable battery may be charged with a large current. However, supplying a large current leads to a rise in the temperature of the battery during rapid charging.

In existing charging systems, a temperature-detecting device is used to detect the rate of temperature rise in the battery. For example, if the rate of temperature rise is large, it indicates that the predetermined heat capacity of the battery is currently at a higher temperature. After detecting the temperature rise in the battery, the charge rate needs to be reduced to reduce the temperature inside the battery and prevent the battery temperature from further rising. The temperature-detecting device is unable to measure the actual battery internal temperature, as the battery internal temperature is much higher than the value detected by the temperature-detecting device. In such a scenario, an increased charging rate results in a rise in the heat generation inside the battery, and the uniform charging time may be disrupted while allowing a certain rise in the internal temperature of the battery. To overcome heating-related issues in the battery, a cooling device is used with the battery, which is designed according to the heat generated during charging and traveling. However, the installation of the cooling device makes the charging system bulky, heavy, and expensive, which is not practical for electric vehicles.

Conventional charging systems for controlling battery charging employ a technique where a battery management system and a vehicle-mounted charger operate together to increase the charging speed in a constant-current stage. Charging efficiency is often improved by optimizing the vehicle-mounted charger. For improved charging efficiency, the vehicle-mounted charger is usually charged with a large charging current. The existing charging systems do not consider the state of the battery in the charging process, and the battery is easily damaged due to the large charging current, reducing the service life of the battery.

Accordingly, one object of the present disclosure is to provide a battery charging system that reduces internal temperature rise and prolongs the life of the battery.

SUMMARY

In an exemplary embodiment, a method for charging a rechargeable battery is described. The method includes connecting a first DC voltage source to an H-bridge circuit. The method includes connecting the H-bridge circuit to a positive terminal of the rechargeable battery. The method further includes connecting a second DC voltage source to the positive terminal. The method includes generating, by the first DC voltage source connected to an H-bridge circuit, a sinusoidal with ripple current. The method includes injecting the sinusoidal with ripple current into the rechargeable battery. The method includes measuring, by an impedance meter, an internal impedance of the rechargeable battery. The method includes identifying, by a microcontroller connected to the impedance meter, a frequency of the sinusoidal with ripple current at which the rechargeable battery has a minimum internal impedance. The method includes recharging the battery with the sinusoidal with ripple current at the identified frequency.

In another exemplary embodiment, a circuit for charging a rechargeable battery with a sinusoidal with ripple current is described. The circuit includes a first DC voltage source, a bus capacitor Cbus connected in parallel with the first DC voltage source, an H-bridge circuit connected in parallel with the first DC voltage source and the bus capacitor Cbus, wherein the H-bridge circuit comprises an output terminal and four transistor switches, wherein each transistor switch includes a gate contact, a rechargeable battery comprising a positive terminal and a negative terminal, wherein the positive terminal is connected to the output terminal of the H-bridge circuit, a second DC voltage source connected to the positive terminal, an impedance meter connected to the negative terminal of the rechargeable battery, wherein the impedance meter is configured to measure an impedance of the rechargeable battery, a microcontroller connected to the impedance meter and to each gate contact, wherein the microcontroller is configured to: generate a set of drive signals which control each transistor switch, wherein the set of drive signals is configured to generate a sinusoidal with ripple current at the output terminal of the H-bridge circuit, adjust a frequency of the sinusoidal with ripple current based on the impedance of the rechargeable battery, identify a frequency of the sinusoidal with ripple current at which the rechargeable battery has a minimum internal impedance, and adjust the set of drive signals to generate the sinusoidal with ripple current at the identified frequency and recharge the rechargeable battery.

In another exemplary embodiment, a method for determining a frequency of a sinusoidal with ripple current which generates a minimum impedance in a rechargeable battery is described. The method includes connecting a first DC voltage source to an H-bridge circuit comprising four transistor switches having gate contacts. The method includes connecting the H-bridge circuit to a positive terminal of the rechargeable battery. The method includes connecting a second DC voltage source to the positive terminal. The method further includes generating, by the first DC voltage source connected to an H-bridge circuit, a sinusoidal with ripple current. The method further includes injecting the sinusoidal with ripple current into the rechargeable battery. The method further includes measuring, by an impedance meter, an internal impedance of the rechargeable battery. The method further includes generating, by a microcontroller connected to each gate contact and the impedance meter, a set of drive signals which control each transistor switch, wherein the set of drive signals is configured to generate a sinusoidal with ripple current at the output terminal of the H-bridge circuit. The method further includes identifying, by the microcontroller, a frequency of the sinusoidal with ripple current at which the rechargeable battery has a minimum internal impedance by: iteratively incrementing the frequency of the sinusoidal with ripple current by incrementing each previous frequency $f_{k-1}$ by an amount given by: $-\alpha(512/2^N)$, where a is a sign of the phase value, and N is a number of the sign changes in the phase value from k equals one to k equals k−1, where N equals zero at k equals one, measuring, by the impedance meter, the internal impedance at each iteration, calculating, by the microcontroller, a phase value of the internal impedance at each iteration, comparing the phase value to a phase error, determining when the phase value is less than the phase error threshold, and adjusting the drive signals to generate the sinusoidal with ripple current at the frequency which has the phase value is less than the phase error threshold, and recharging the battery with the sinusoidal with ripple current at the identified frequency.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
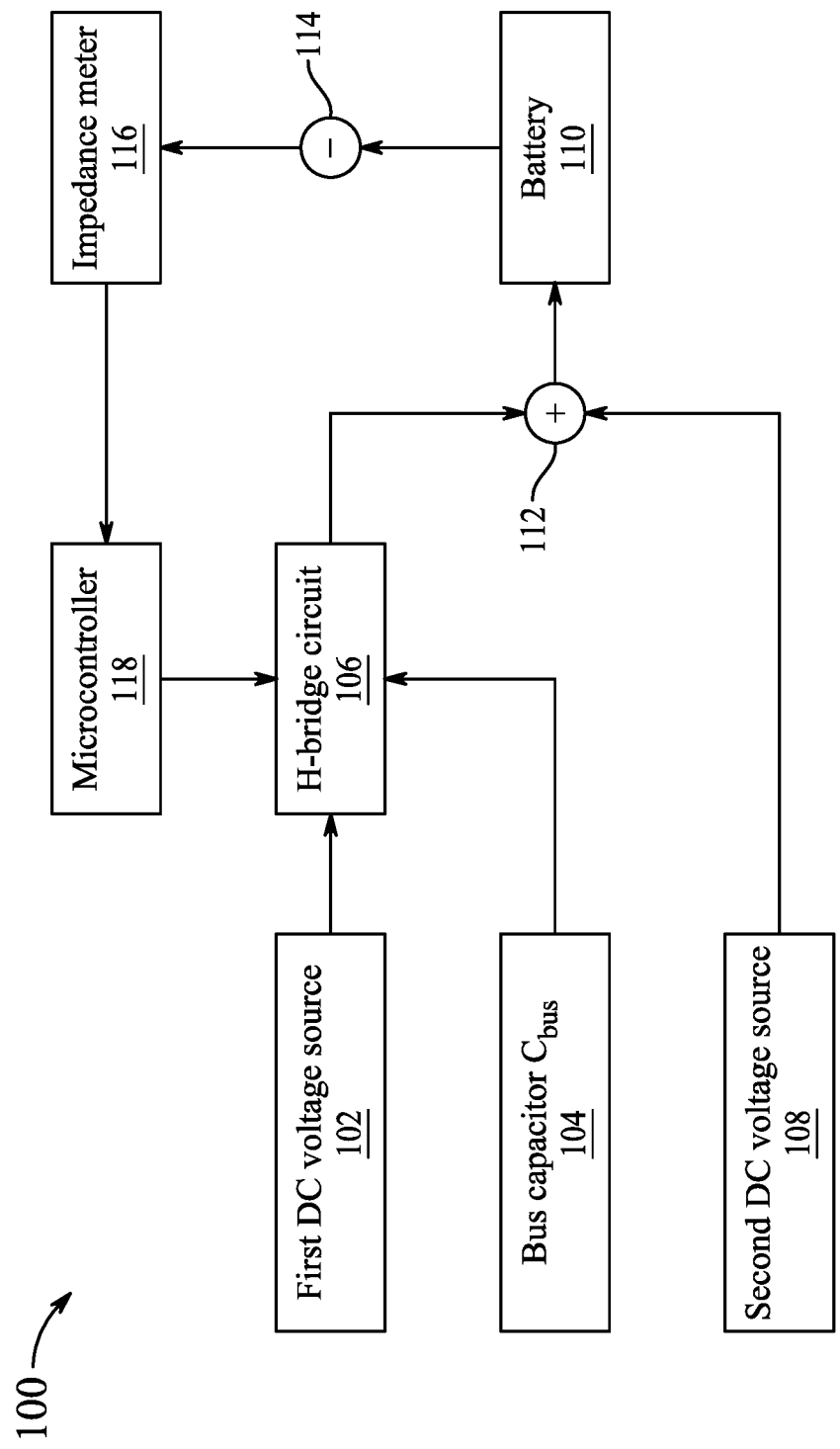
FIG. 1 is an exemplary schematic diagram of a circuit for charging a rechargeable battery, according to certain embodiments.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Aspects of this disclosure are directed to a circuit for charging a rechargeable battery with a sinusoidal ripple current. The circuit is configured to generate a charging current (having a sinusoidal component with DC shift) at which the rechargeable battery has a minimum internal impedance. The circuit employs a frequency search algorithm that identifies and tracks the desired frequency of the sinusoidal component of the charging current at which the rechargeable battery has the minimum internal impedance. In the circuit of the present disclosure, an H-bridge circuit is used for generating the required charging current. The H-bridge circuit is simple and has a low cost, which allows implementation at a relatively low cost. The search algorithm is adaptive since a step size of the frequency search algorithm is variable. Initially, the search algorithm starts with a large step size for a fast convergence speed. As the search algorithm gets closer to the desired frequency value, the step size is decreased by dividing the step size by two (2) after each iteration to improve the accuracy of the search algorithm.

The circuit is configured to offer a low cost controlled frequency AC power supply for the battery charging. The circuit improves the charging time by reducing the internal losses in the form of heat during the charging process and extends the lifetime of the battery.

FIG. 1 is an exemplary schematic diagram of a circuit for charging a rechargeable battery with a sinusoidal with ripple current (hereinafter interchangeably referred to as "circuit 100"), according to certain embodiments. As shown in FIG. 1, the circuit 100 includes a first direct current (DC) voltage source 102, a bus capacitor $C_{bus}$ 104, an H-bridge circuit 106, a second DC voltage source 108, a rechargeable battery 110, an impedance meter 116, and a microcontroller 118.

The first DC voltage source 102 is configured to generate a first predetermined DC voltage. In an aspect, the first DC voltage source 102 is selected from a group of a primary battery, a secondary battery, a fuel cell, a metal-air battery, a solar cells, a wind cell, a solar cell array, a fuel cell, a rectified AC power, a solar generator, a thermoelectric generator, a rechargeable battery, a redox flow battery, a super capacitor, an electromagnetic generator, an alternating-current (AC)/direct current (DC) converter and a DC/DC converter.

The bus capacitor $C_{bus}$ 104 is connected in parallel with the first DC voltage source 102. The bus capacitor $C_{bus}$ 104 is configured to reduce voltage ripple and bypass any current ripple. In an aspect, the selection of a type of the bus capacitor $C_{bus}$ 104 is based on application requirements and circuit parameters. In an aspect, the bus capacitor $C_{bus}$ 104 absorbs ripple current created by the H-bridge circuit 106. To absorb the ripple current, the bus capacitor $C_{bus}$ 104 may include one or more capacitors to smooth the ripple current and propagating harmonics.

The H-bridge circuit 106 is connected to the first DC voltage source 102 and the rechargeable battery 110. The H-bridge circuit 106 is connected in parallel with the first DC voltage source 102 and the bus capacitor $C_{bus}$. The H-bridge circuit 106 is configured to generate a sinusoidal with ripple current. The H-bridge circuit 106 is configured to switch the polarity of the first predetermined DC voltage received from the first DC voltage source 102 and deliver sinusoidal with ripple current to a load. In an example, the H-bridge circuit 106 has four transistor switches that control the flow of the current delivered to the load. By using the H-bridge circuit 106 with one current source, the current can be transmitted in two directions by closing two switches of the H-bridge circuit 106.

The rechargeable battery 110 (storage battery, or secondary cell), is a type of electrical battery which can be charged, discharged into the load, and recharged many times. The rechargeable battery 110 includes a positive terminal 112 and a negative terminal 114. The positive terminal 112 is connected to an output terminal of the H-bridge circuit 106. The negative terminal 114 of the rechargeable battery 110 is connected to the impedance meter 116. For example, the rechargeable battery 110 is a lithium-ion battery or a lead-acid battery.

The second DC voltage source 108 is connected to the positive terminal 112 of the rechargeable battery 110. The second DC voltage source 108 is configured to function as an additional voltage source that generates a second predetermined DC voltage as output. For example, the first DC voltage source 102 is a high-voltage battery, and the second DC voltage source 108 is a battery such as a lead battery.

The impedance meter 116 is connected to the negative terminal 114 of the rechargeable battery 110. The impedance meter 116 is configured to measure an impedance of the rechargeable battery 110. In an aspect, the impedance meter 116 is configured to measure current and voltage of the rechargeable battery 110. In some examples, the circuit 100 may employ an inductance-capacitance-resistance (LCR) meter and impedance analyzers for measuring impedance. In an example, the impedance meter 116 is configured to measure an internal impedance of the rechargeable battery 110 periodically for example, after each iteration.

In an aspect, the circuit 100 has circuitry including a memory storing program instructions and a microcontroller 118 configured to perform the program instructions. According to an aspect of the present disclosure, the microcontroller 118 may be implemented as one or more microprocessors, microcomputers, digital signal processors, central processing units, state machines, logic circuitries, and/or any devices that manipulate signals based on operational instructions. Among other capabilities, the microcontroller 118 may be configured to fetch and execute computer-readable instructions stored in the memory. In an aspect, the memory is configured to store a set of predetermined values of frequencies corresponding to different internal impedances and a phase error threshold. The memory may be coupled to the microcontroller 118 and may include any computer-readable medium known in the art including, for example, volatile memory, such as static random access memory (SRAM) and dynamic random access memory (DRAM) and/or nonvolatile memory, such as read only memory (ROM), erasable programmable ROM, flash memories, hard disks, optical disks, and magnetic tapes.

The microcontroller 118 is connected to the impedance meter 116 and to the H-bridge circuit 106. In a connection aspects, the microcontroller 118 is connected to each gate contact of each transistor switch in the H-bridge circuit 106. The microcontroller 118 is configured to generate a set of drive signals for controlling each transistor switch of the H-bridge circuit 106. In an aspect, the H-bridge circuit 106 is configured to employ an auto-search algorithm that tracks a zero-crossing frequency at which an imaginary part of the rechargeable battery impedance is zero (this is almost the same frequency at which the impedance is minimum). By employing the auto-search algorithm, the microcontroller 118 is capable of controlling the frequency of the sinusoidal with ripple current.

In an operational aspect, using the auto-search algorithm, the microcontroller 118 is configured to adjust the frequency of the sinusoidal with ripple current based on the impedance of the rechargeable battery 110. The microcontroller 118 identifies a frequency of the sinusoidal with ripple current at which the rechargeable battery 110 has a minimum internal impedance. Based on the identified frequency, the microcontroller 118 is configured to modify the set of drive signals to be fed to the H-bridge circuit 106. Based upon the modified set of drive signals, the H-bridge circuit 106 generates the sinusoidal with ripple current at the identified frequency and recharges the rechargeable battery 110. In an example, the microcontroller 118 is further configured to adjust the frequency of the sinusoidal with ripple current by adjusting the timing of the drive signals. For example, the microcontroller 118 may be configured to feed the drive signals to all the transistor switches at once or simultaneously.

In an operative aspect, the microcontroller 118, using the auto-search algorithm, is configured to iteratively increment the frequency of the sinusoidal with ripple current. After each increment of the frequency of the sinusoidal with ripple current, the impedance meter 116 is configured to measure the internal impedance at each iteration. The microcontroller 118 is configured to calculate a phase value of the internal impedance at each iteration. The microcontroller 118 is configured to compare the calculated phase value to the phase error and determines when the phase value is less than the phase error threshold. If the phase value is more than the phase error threshold, the microcontroller 118 is configured to adjust the drive signals to generate the sinusoidal with ripple current at the frequency having the phase value less than the phase error threshold.

For each iteration k, the microcontroller 118 is configured to iteratively increment the frequency $f_k$ by incrementing a previous frequency $f_{k-1}$ by an amount given by $-\alpha(512/2^N)$, where a is a sign of the phase value, and N is a number of the sign changes in the phase value from k equals one to k, where N equals zero when k is equal to one.

For an example, the microcontroller 118 is configured to select an initial value of the frequency $f_0$ at k equals one from the range of 100 Hz to 500 Hz.

The microcontroller 118 is configured to identify, for each iteration k, a minimum current and a minimum voltage from the impedance measurement. The microcontroller 118 calculates each phase value by subtracting the minimum voltage from the minimum current, taking an absolute value of the difference, and multiplying the absolute value by the frequency $f_k$ of the sinusoidal with ripple voltage times 360 degrees.

Figure 2:
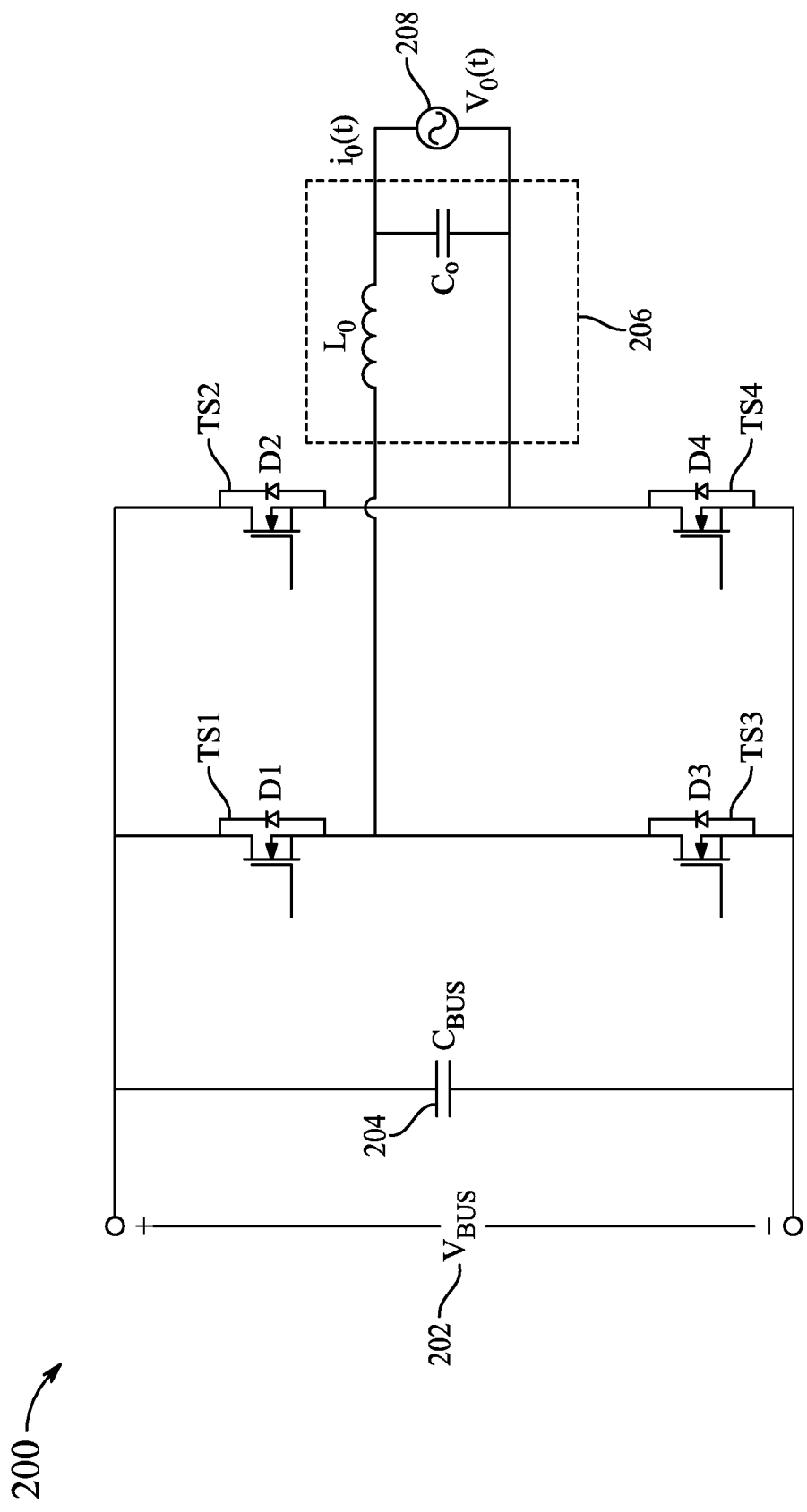
FIG. 2 is an exemplary design for an H-bridge circuit, according to certain embodiments.

FIG. 2 is an exemplary design 200 for the H-bridge circuit 106, according to certain embodiments. As shown in FIG. 2, the H-bridge circuit 106 includes an input terminal 202, a bus capacitor $C_{bus}$ 204, four transistor switches (TS1, TS2, TS3, and TS4), four diodes (D1, D2, D3, and D4), a LC filter 206, and an output terminal 208. The H-bridge circuit 106 is a full bridge inverter that converts DC power into AC power. The input terminal 202 is configured to connect with at least one of the first DC voltage source 102 and the second DC voltage source 108. The input terminal 202 is configured to receive the DC voltage from the voltage source.

The H-bridge circuit 106 alternates the polarity of voltage by operating two transistor switches at a time. During the positive input voltage, the transistors TS1 and TS4 are ON and TS2 and TS3 are OFF. During the negative input voltage, the transistors TS2 and TS3 are ON and TS1 and TS4 are OFF. The H-bridge circuit 106 is configured to operate in the following modes:

Mode 1: Initially, all the transistor switches are OFF. By triggering TS1 and TS4, the input DC voltage (+Vdc) will appear across the output terminal 208. The current flow in clockwise direction from source to the series connected load (load connected to the output terminal 208).

Mode 2: The transistor switches TS2 and TS3 are triggered immediately after completely commutating TS1 and TS4. The polarity of voltage immediately reverses after switching complementary switches TS1 and TS4 with TS3 and TS2. The DC input voltage will appear with the negative voltage across the load.

Each of the transistor switches (TS1, TS2, TS3, and TS4) includes a gate contact, a first contact to receive an input voltage, and a second contact to generate an output voltage. For example, the transistor switch is a metal-oxide-semiconductor field-effect transistor (MOSFET). In an example, the MOSFET is an N-Channel Depletion MOSFET. In an aspect, both positive and negative voltages can be applied on the gate contact. The voltage applied at the gate contact determines the conductivity of the MOSFET and the H-bridge circuit 106. In an aspect, the gate contact is coupled to the microcontroller 118 and receives the set of drive signals for controlling a magnitude of a current flowing through the transistor switches (TS1, TS2, TS3, and TS4). By applying the set of drive signals, the gate contact is configured to change conductivity with the amount of applied voltage; therefore, the transistor switch is used for varying, amplifying, or switching electronic signals (input voltage). Based on the received set of drive signals, the H-bridge circuit 106 is configured to generate the sinusoidal with ripple current at the output terminal 208.

For example, the microcontroller 118 generates the set of drive signals for adjusting the frequency of the sinusoidal with ripple current based on the impedance of the rechargeable battery 110. Each of the transistor switches (TS1, TS2, TS3, and TS4) receives the set of drive signals from the microcontroller 118. In an example, the drive signal represents a varying voltage applied to the gate contact of each of the transistor switches (TS1, TS2, TS3, and TS4). The varying voltage signal applied to the gate contact causes a change in the output current of the transistor.

The LC filter 206 is connected to the output terminal 208 of the H-bridge circuit 106. The LC filter 206 receives the varying output current from the transistor switches. The LC filter 206 with an inductor L and a capacitor C is used to produce a pure sinusoidal voltage. In an aspect, the LC filter 206 combines the inductor L and the capacitors C to form a low-pass, high-pass, band-pass, or band-reject filtering in radio frequency (RF) applications. In an example, the LC filter 206 blocks or reduces noise (EMI) from circuits and systems, and separates, or conditions, desired signals.

The output terminal 208 of the H-bridge circuit 106 is configured to output the generated sinusoidal with ripple current to the positive terminal 112 of the rechargeable battery 110. The sinusoidal with ripple current is used to charge the load connected across the output terminal 208 of the H-bridge circuit 106, that is, the rechargeable battery 110.

Figure 3:
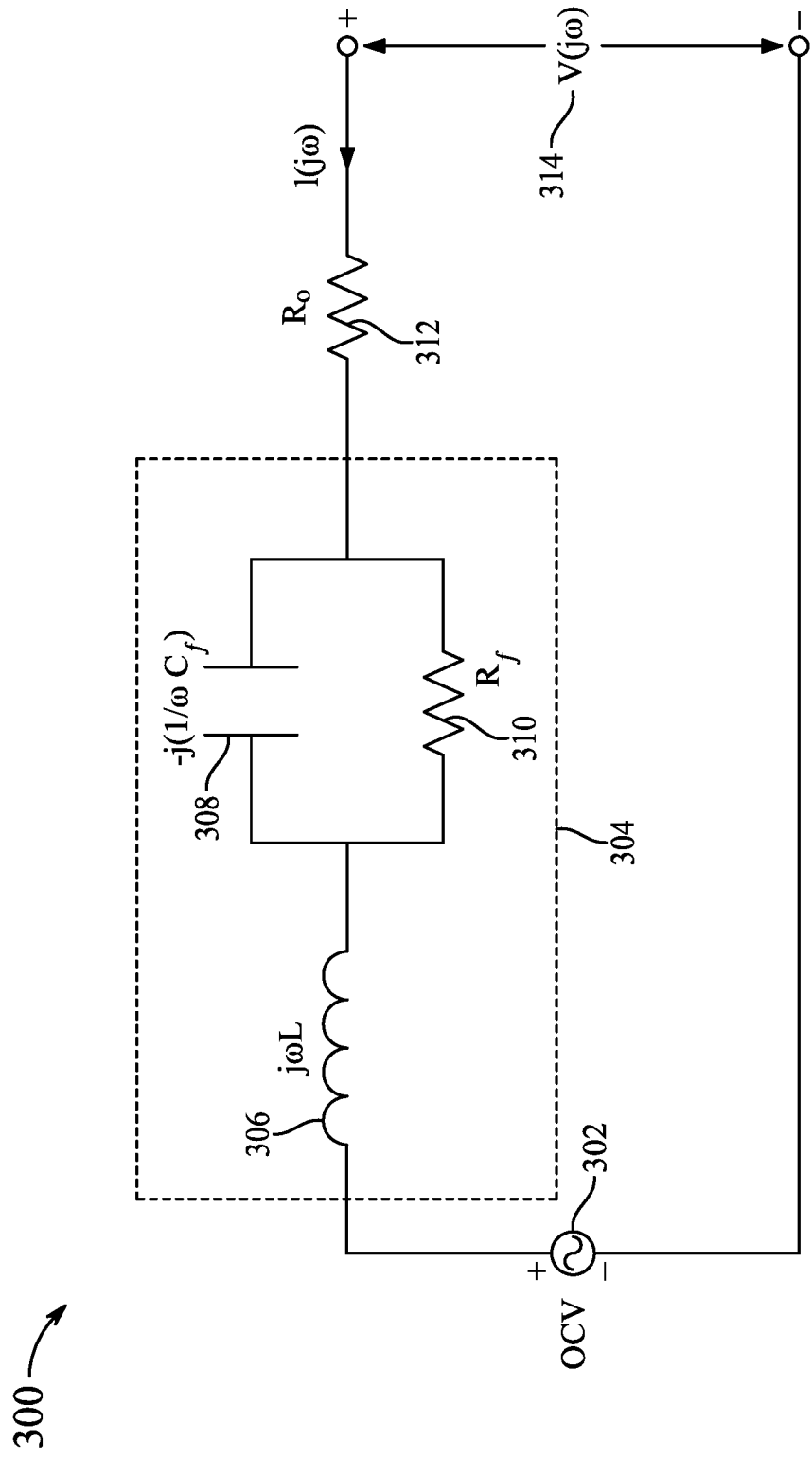
FIG. 3 is an exemplary design of an AC battery cell model in frequency domain, according to certain embodiments.

FIG. 3 is an exemplary design for an AC battery cell model 300 in a frequency domain, according to certain embodiments. The AC battery cell model 300 includes an input 302, a resistor, inductor, capacitor (RLC) circuit 304, an output resistance 312, and an output 314. In an example, the AC battery cell model 300 operates in an open-circuit voltage (OCV) mode, in which an ideal battery is modeled as an ideal voltage source. In the model 300, the voltage is not a function of current, nor a function of past usage. In an aspect, during the implementation of the AC battery cell model 300, the voltage is taken as constant. In an example, the AC battery cell model 300 is configured to employ to predict the performance of the rechargeable battery 110. The AC battery cell model 300 describes how the battery characteristics (capacity and impedance) change over time.

The RLC circuit 304 includes a inductor 306, a capacitor 308, and a resistor 310. As shown in FIG. 3, the capacitor 308 and the resistor 310 are in a parallel configuration which is in series with the inductor 306. In an aspect, the output 314 represents the performance of the rechargeable battery 110. For example, the output 314 represents changes in capacitance and impedance of the rechargeable battery 110. It can be seen from FIG. 3, the battery cell impedance includes resistive, capacitive and inductive elements. At low frequencies, the inductive element has a negligible impact while the capacitive element is dominant. At high frequencies, the inductive element dominates the impedance value while the capacitive component is insignificant and can be neglected. For example, at a certain frequency, i.e., at 0.8 kHz for the battery cell, the inductive and capacitive elements neutralize each other, and the impedance is purely resistive.

In an operative aspect, by allowing a charger (with the circuit 100 installed or attached) to track the zero-crossing frequency at any condition, i.e., any operating temperature, state-of-charge or state-of-health conditions, the battery will be charged at the highest possible efficiency, resulting in minimal internal heat generated and the battery cell is protected.

The circuit 100 is configured to determine the impedance of the rechargeable battery 110 in real-time at any frequency to adjust the charging rate.

The sinusoidal charging current (sinusoidal with ripple current) in equation (1) can be generated by adding an AC sinusoid to the average or DC charging current reference value. As shown in equation (1), $I_M$ is the magnitude of the average or DC battery charging current reference value that is required to regulate the charging current to the desired level.

$$I_{batt\_ref} = I_{batt\_ref\_DC} + I_{batt\_ref\_AC} \qquad (1)$$
$$= I_M + I_M \sin(2\pi f_{optim} t)$$

The value of $I_M$ is determined based on the load (battery) power requirements. In an example, a perturbation frequency in (1) is initialized, then the microcontroller 118 is configured to run the auto-search algorithm to find $f_{optim}$ (a frequency at which the rechargeable battery 110 has minimum internal impedance).

During the implementation of the AC battery cell model 300, the inductive component may be neglected at low frequencies. Therefore, the AC battery cell model 300 can be equivalent to an RC model at low frequencies. The impedance, impedance magnitude and impedance phase at the cell's terminals for the approximated RC model are given by equations (2)-(4).

$$Z = \frac{R_o + R_f + \omega^2 R_o R_f^2 C_f^2 - j\omega R_f^2 C_f}{1 + \omega^2 R_f^2 C_f^2}, \quad (2)$$

$$|Z| = \frac{((R_o + R_f + \omega^2 R_o R_f^2 C_f^2)^2 + (\omega R_f^2 C_f)^2)^{\frac{1}{2}}}{1 + \omega^2 R_f^2 C_f^2}, \quad (3)$$

$$\theta_Z = \tan^{-1}\left(\frac{-\omega R_f^2 C_f}{R_o + R_f + \omega^2 R_o R_f^2 C_f^2}\right), \quad (4)$$

According to equations (2) through (4), the parameters of the model 300 can be used to calculate the battery impedance at a given frequency.

In an alternate example, the magnitude and phase of the battery impedance can be directly measured using the auto-search algorithm, without using the equations. In the present circuit 100, as the sinusoidal perturbation is employed corresponding to a battery charging reference value, the battery voltage will have a sinusoidal response at the perturbation frequency.

Figure 4:
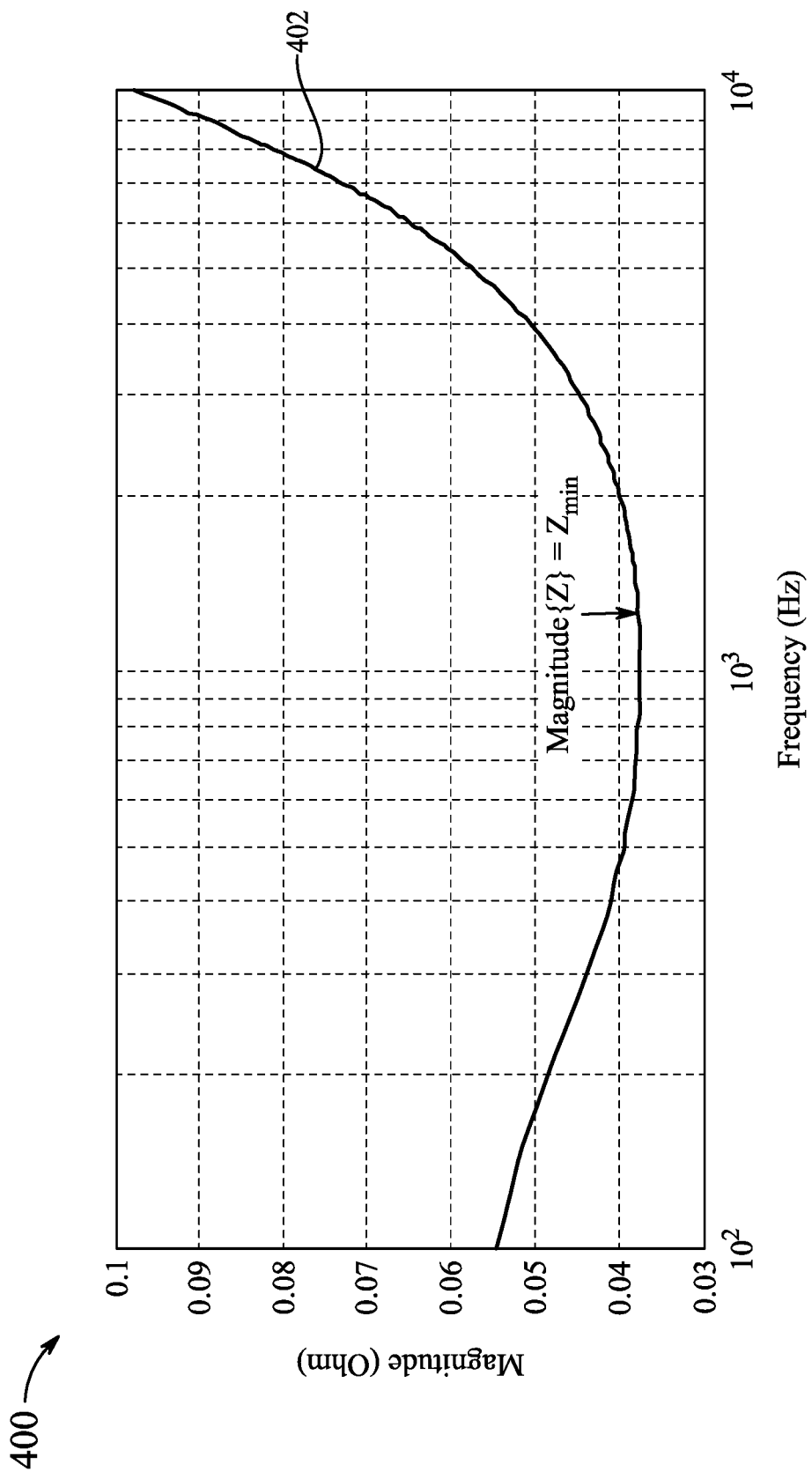
FIG. 4 is an exemplary graph showing an impedance magnitude versus frequency of a lithium-ion battery cell, according to certain embodiments.

FIG. 4 is a plot representation 400 of the magnitude of the rechargeable battery 110 as a function of frequency, according to certain embodiments. Curve 402 illustrates impedance values corresponding to various frequencies of the sinusoidal with ripple current. For example, curve represent at value internal impedance of the rechargeable battery 110 along the frequency. As shown in FIG. 4, the rechargeable battery 110 has minimum internal impedance around $10^3$ Hz.

Figure 5:
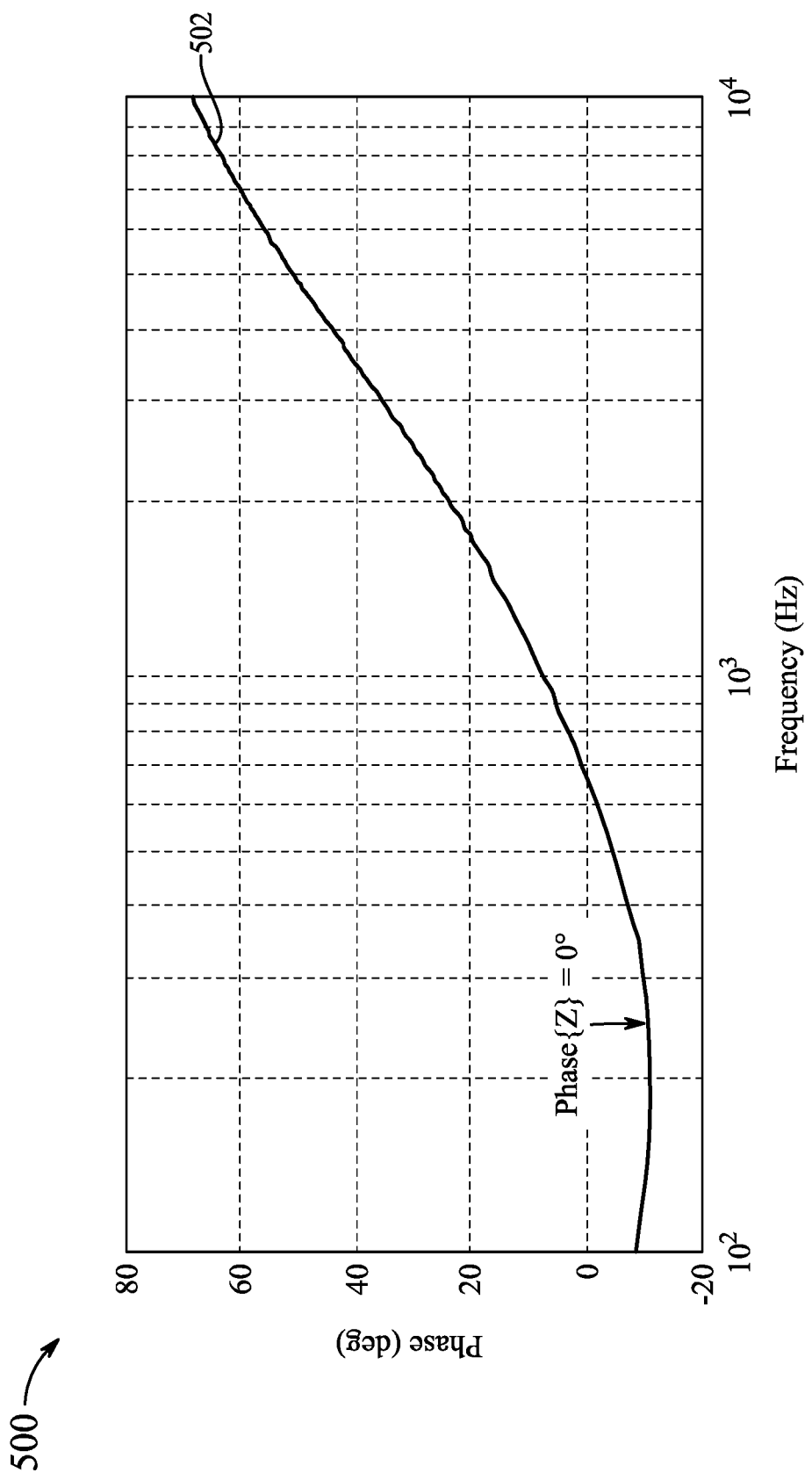
FIG. 5 is an exemplary graph illustrating an impedance phase versus frequency of the lithium-ion battery cell, according to certain embodiments.

FIG. 5 is a plot representation 500 of the phase value of the impedance (phase impedance value) of the rechargeable battery 110 as a function of frequency, according to certain embodiments. Curve 502 illustrates phase impedance values corresponding to various frequencies of the sinusoidal with ripple current. As shown in FIG. 5, the impedance has a decreasing trend as the frequency increases from 0 Hz up to 0.8-1 kHz. For higher frequencies, the impedance increases as the frequency of the sinusoidal with ripple current increases.

Figure 6:
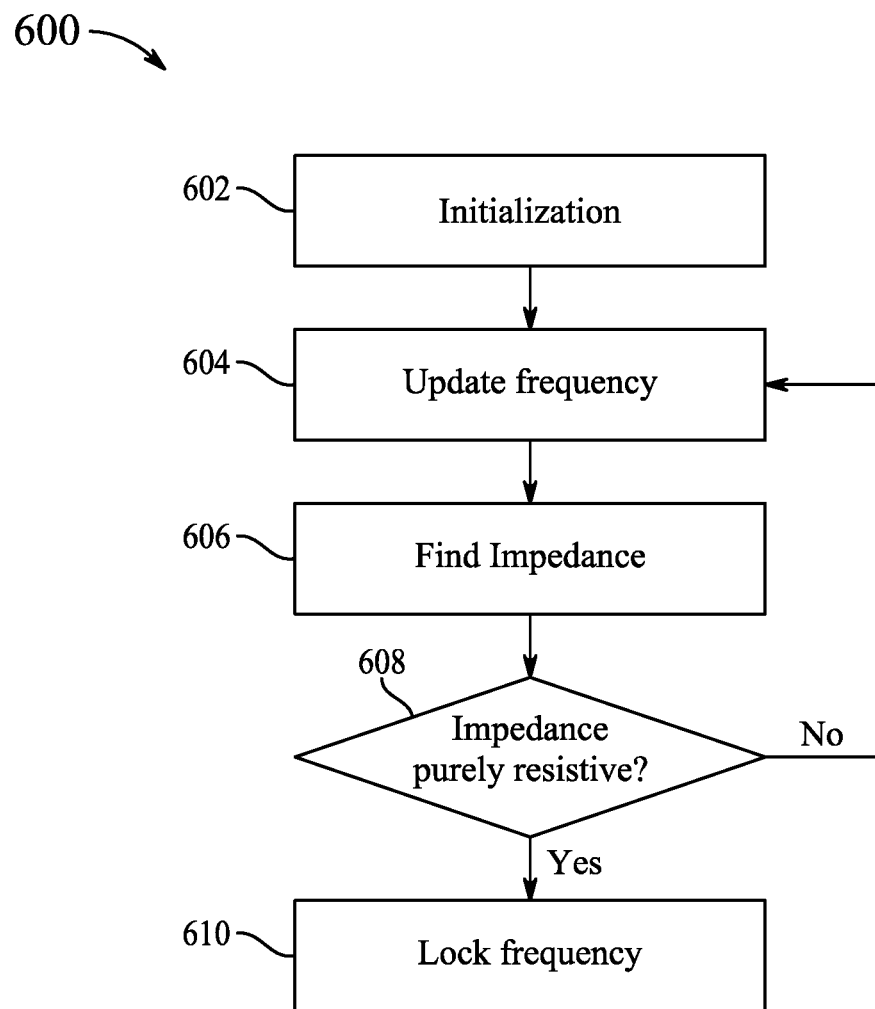
FIG. 6 is a flow chart for charging the rechargeable battery, according to certain embodiments.

FIG. 6 is a flow chart 600 for charging a rechargeable battery 110, according to certain embodiments. Step 602 includes initialization of the charging the rechargeable battery 110. During the initialization step, the first DC voltage source 102 is connected to the H-bridge circuit 106. The H-bridge circuit 106 is connected to the positive terminal 112 of the rechargeable battery 110. The second DC voltage source 108 is connected to the positive terminal 112 of the rechargeable battery 110. The first DC voltage source 102 is connected to the H-bridge circuit 106 and generates a sinusoidal with ripple current. The sinusoidal with ripple current is injected into the rechargeable battery 110. The impedance meter 116 measures an internal impedance of the rechargeable battery 110. The microcontroller 118, connected to the impedance meter 116, is configured to identify a frequency of the sinusoidal with ripple current at which the rechargeable battery 110 has a minimum internal impedance and recharge the battery 110 with the sinusoidal with ripple current at the identified frequency.

Step 604 includes updating the frequency of the sinusoidal with ripple current such that the at updated minimum frequency of the sinusoidal with ripple current, the rechargeable battery 110 has minimum internal impedance. To find the minimum frequency of the sinusoidal with ripple current the microcontroller 118 increments the frequency iteratively.

Step 606 includes finding updated impedance of the impedance meter 116. The microcontroller 118 is configured to identify internal impedance of the rechargeable battery 110 corresponding to the updated frequency.

Step 608 includes determining whether the identified internal impedance of the rechargeable battery 110 is purely resistive. In an example, in the RLC circuit at a resonant frequency at which the total impedance is purely resistive. If the identified internal impedance of the rechargeable battery 110 is not purely resistive, then the microcontroller 118 is configured to update the frequency of the sinusoidal with ripple current.

Step 610 includes locking the frequency at which identified internal impedance of the rechargeable battery 110 is purely resistive.

Figure 7:
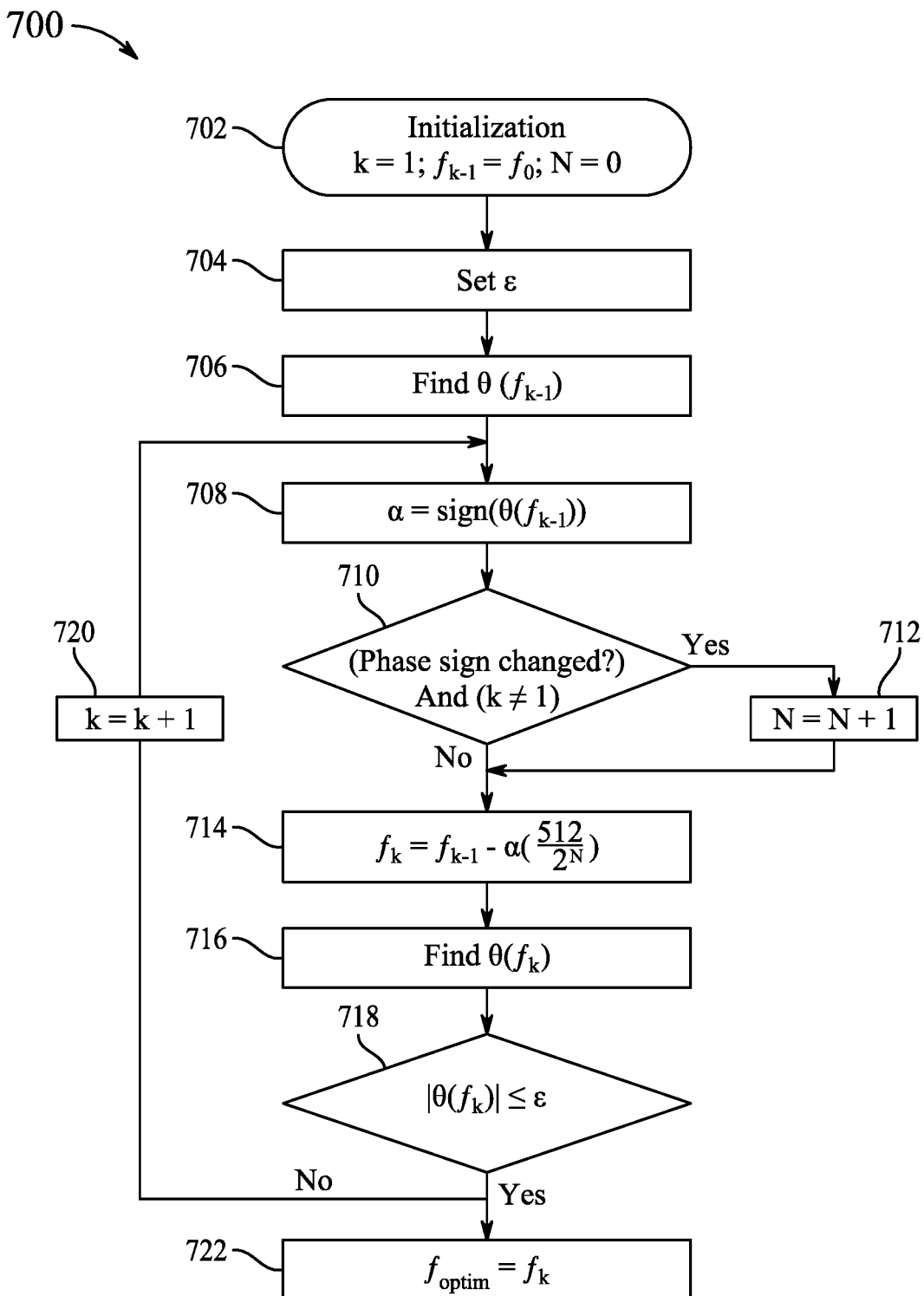
FIG. 7 is a flow chart for selecting a charging frequency at which the rechargeable battery has a minimum internal impedance, according to certain embodiments.

FIG. 7 is a flow chart 700 for performing the auto-search algorithm for selecting a charging frequency at which the rechargeable battery 110 has the minimum internal impedance, according to certain embodiments. To execute the auto-search algorithm, the impedance of the rechargeable battery 110 is required to be determined in real-time using the microcontroller 118 such that the charging rate of the rechargeable battery 110 is maximized.

The auto-search algorithm for selecting the charging frequency mainly operates on the equation (5) given as:

$$f_k = f_{k-1} - \alpha\left(\frac{512}{2^N}\right), \quad (5)$$

where k is the iteration number, f is the charging frequency, α is the sign of the phase (1 if positive and −1 if negative), and N is the number of sign changes in the measured phase.

According to the equation (5), a step size used at each iteration depends on the phase sign and number of sign changes in the impedance phase. If the phase is negative, α will be equal to −1, causing the frequency to increase. Similarly, if the phase is positive, α will be +1 and hence the frequency will be decremented. The value of N is selected as zero initially. The larger the number of the sign changes detected, the closer the auto-search algorithm will be to the charging frequency; hence, the step size will decrease as N increases. The auto-search algorithm is simple to execute, robust and stable.

Step 702 includes initializing the auto-search algorithm. During the initialization, an initial optimal perturbation frequency is selected. In an aspect, the initial optimal perturbation frequency is selected from a range of 100 Hz and 500 Hz based on the previous experiments. The iteration number is initialized (k=1) and so the number of sign changes in the impedance phase (N=0).

Step 704 includes setting the value of error ε. In an aspect, the error ε determines the accuracy of the charging frequency selected by the microcontroller 118. In an example, the error value of 0.1° is selected. A convergence speed can be increased by increasing ε at the cost of reducing the accuracy.

Step 706 includes measuring the value of impedance phase θ(f$_{k-1}$) using the following equation:

$$\theta = f_k \cdot (360°) \cdot (t_{I_{min}} - t_{V_{min}}), \quad (6)$$

where f$_k$ is the charging frequency at the k$^{th}$ iteration and t$_{I_{min}}$ and t$_{V_{min}}$ are the times at which the current and voltage have minimum values.

Step 708 includes determining α, i.e., the sign of the phase (1 if positive and −1 if negative).

Step 710 includes determining whether the phase sign changed or not. Step 710 also includes determining whether the value of k is equal to 1 or not. If the phase sign is changed then the number of sign changes N is determined. For the first iteration (i.e. k=1), N is equal to 0; for the following iterations (i.e. k≠1), if the phase sign of θ (f$_{k-1}$) changes, the value of N increases by one.

Step 712 includes incrementing N by 1 if it is determined that the phase sign has been changed.

Step 714 includes selecting the charging frequency using the equation (z) given as:

$$f_k = f_{k-1} - \alpha \left( \frac{512}{2^N} \right), \quad (7)$$

where k is the iteration number, f$_k$ is the charging frequency, α is the sign of the phase (1 if positive and −1 if negative), and N is the number of sign changes in the measured phase.

Step 716 includes calculating phase value of the charging frequency (θ(f$_k$)) at the current iteration θ(f$_k$). The value of α is based on the sign of θ(f$_k$); if θ(f$_{k-1}$) is negative, that means the impedance is capacitive and hence the frequency is incremented (i.e. α=−1). On the other hand, if θ(f$_{k-1}$) is positive, the impedance will be inductive and hence the frequency is decremented (i.e. α=1).

Step 718 includes determining whether the phase value θ(f$_k$) is less than E or not.

Step 720 includes incrementing the k by 1 if the phase value θ(f$_k$) is not less than e and the search process comes back to Step 708 and continues to search for the charging frequency f$_{optim}$.

Step 722 includes setting the optimum charging frequency f$_{optim}$. If the phase value θ(f$_k$) is less than ε, then the charging frequency f$_{optim}$ is set as f$_k$.

In an operative aspect, the circuit 100 identifies the frequency of the sinusoidal with ripple current at which the rechargeable battery 110 has minimum internal impedance by injecting a first frequency of the sinusoidal with ripple current into the rechargeable battery 110. After injecting the first frequency of the sinusoidal with ripple current, the circuit 100 measures a first impedance of the rechargeable battery 110 by the impedance meter 116. Also, the circuit 100 measures a phase value of the first impedance using the microcontroller 118. The microcontroller 118 increments the first frequency based on the measured phase value. The circuit 100 measures a second impedance of the rechargeable battery 110 by the impedance meter 116. The microcontroller 118 measures a phase of the second impedance. The microcontroller 118 increments continuously each previous frequency f$_{k+1}$, by an amount given by −α(512/2$^N$), where a is a sign of the phase value, and N is a number of the sign changes in the phase value from k equals one to k equals k−1, where N equals zero at k equals one. The microcontroller 118 measures the impedance and the phase value until the phase value of the impedance is less than an error threshold F.

The first embodiment is illustrated with respect to FIG. 1-FIG. 7. The first embodiment describes a method for charging a rechargeable battery 110. The method includes connecting a first DC voltage source 102 to an H-bridge circuit 106. The method includes connecting the H-bridge circuit 106 to a positive terminal 112 of the rechargeable battery 110. The method includes connecting a second DC voltage source 108 to the positive terminal 112. The method further includes generating, by the first DC voltage source 102 connected to an H-bridge circuit 106, a sinusoidal with ripple current. The method further includes injecting the sinusoidal with ripple current into the rechargeable battery 110. The method further includes measuring, by an impedance meter 116, an internal impedance of the rechargeable battery 110. The method further includes identifying, by a microcontroller 118 connected to the impedance meter 116, a frequency of the sinusoidal with ripple current at which the rechargeable battery 110 has a minimum internal impedance. The method further includes recharging the battery 110 with the sinusoidal with ripple current at the identified frequency.

In an aspect, the method further includes identifying, by the microcontroller 118, the minimum frequency of the sinusoidal with ripple current at which the rechargeable battery 110 has minimum internal impedance by: iteratively incrementing the frequency; performing, by a microcontroller 118 connected to the inverter, an auto-search to identify a zero-crossing frequency at which an imaginary part of the battery 110 impedance is zero.

In an aspect, the method further includes iteratively incrementing the frequency by incrementing a previous frequency f$_{k-1}$ by an amount given by: −α(512/2$^N$), where a is a sign of the phase value, and N is a number of the sign changes in the phase value from k equals one to k equals k−1, where N equals zero at k equals one.

In an aspect, the method further includes generating, by the microcontroller 118, drive signals which control each switch in the H-bridge circuit 106, wherein iteratively incrementing the frequency of the sinusoidal with ripple current includes incrementing, by the microcontroller 118, a frequency of the drive signals.

In an aspect, the method further includes identifying the frequency of the sinusoidal with ripple current at which the rechargeable battery 110 has minimum internal impedance by: injecting a first frequency of the sinusoidal with ripple current into the rechargeable battery 110; measuring, by the impedance meter 116, a first impedance of the rechargeable battery 110; measuring, by the microcontroller 118, a phase value of the first impedance; incrementing the first frequency; measuring, by the impedance meter 116, a second impedance of the rechargeable battery 110; measuring, by the microcontroller 118, a phase of the second impedance; and continuing to increment, by the microcontroller 118, each previous frequency f$_{k-1}$, wherein k is an iteration number, and measure the impedance and the phase value until the phase value of the impedance is less than an error threshold ε.

In an aspect, the method further includes incrementing each previous frequency f$_{k-1}$ by an amount given by: −α(512/2$^N$), where α is a sign of the phase value, and N is a number of the sign changes in the phase value over the iteration from k equals one to k, where N equals zero at k equals one.

In an aspect, the error threshold ε is 0.1 degrees.

In an aspect, the method further includes identifying, by the microcontroller 118, for each iteration k, a minimum current and a minimum voltage; and calculating, by the microcontroller 118, each phase value by subtracting the minimum voltage from the minimum current, taking the absolute value of the difference and multiplying the absolute value by the frequency $f_k$ of the sinusoidal with ripple voltage times 360 degrees.

In an aspect, the first frequency is 100 Hz.

In an aspect, the first frequency is selected from the range consisting of 100 Hz to 500 Hz.

In an aspect, the second frequency equals the first frequency plus $-\alpha \times 256$ kHz, wherein $\alpha$ is $+1$ if the impedance is capacitive and a is $-1$ if the impedance is inductive.

The second embodiment is illustrated with respect to FIG. 1-FIG. 7. The second embodiment describes a circuit 100 for charging a rechargeable battery 110 with a sinusoidal with ripple current. The circuit 100 includes a first DC voltage source 102, a bus capacitor $C_{bus}$ 104, an H-bridge circuit 106, a rechargeable battery 110, a second DC voltage source 108, an impedance meter 116, and a microcontroller 118. The bus capacitor $C_{bus}$ 104 is connected in parallel with the first DC voltage source. The H-bridge circuit 106 is connected in parallel with the first DC voltage source 102 and the bus capacitor $C_{bus}$ 104. The H-bridge circuit 106 includes an output terminal and four transistor switches. Each transistor switch includes a gate contact. The rechargeable battery 110 has a positive terminal 112 and a negative terminal 114. The positive terminal 112 is connected to the output terminal of the H-bridge circuit 106. The second DC voltage source 108 is connected to the positive terminal 112. The impedance meter 116 is connected to the negative terminal 114 of the rechargeable battery 110. The impedance meter 116 is configured to measure an impedance of the rechargeable battery 110. The microcontroller 118 is connected to the impedance meter 116 and to each gate contact. The microcontroller 118 is configured to: generate a set of drive signals which control each transistor switch, wherein the set of drive signals is configured to generate a sinusoidal with ripple current at the output terminal of the H-bridge circuit 106; adjust a frequency of the sinusoidal with ripple current based on the impedance of the rechargeable battery 110; identify a frequency of the sinusoidal with ripple current at which the rechargeable battery 110 has a minimum internal impedance; and adjust the set of drive signals to generate the sinusoidal with ripple current at the identified frequency and recharge the rechargeable battery 110.

In an aspect of the present disclosure, an LC filter 206 is connected to the output terminal of the H-bridge circuit 106.

In an aspect, the microcontroller 118 is configured to adjust the frequency of the sinusoidal with ripple current by adjusting a timing of the drive signals.

In an aspect, the microcontroller 118 is configured to iteratively increment the frequency of the sinusoidal with ripple current. The impedance meter 116 is configured to measure the internal impedance at each iteration. The microcontroller 118 is configured to calculate a phase value of the internal impedance at each iteration, compare the phase value to a phase error, determine when the phase value is less than the phase error threshold, and adjust the drive signals to generate the sinusoidal with ripple current at the frequency having the phase value less than the phase error threshold.

In an aspect, the microcontroller 118 is configured to iteratively increment, for each iteration k, the frequency $f_k$ by incrementing a previous frequency $f_{k-1}$ by an amount given by: $-\alpha(512/2^N)$, where a is a sign of the phase value, and N is a number of the sign changes in the phase value from k equals one to k, where N equals zero at k equals one.

In an aspect, the microcontroller 118 is configured to select an initial value of the frequency $f_0$ at k equals one from the range of 100 Hz to 500 Hz.

In an aspect, the microcontroller 118 is configured to identify, for each iteration k, a minimum current and a minimum voltage from the impedance measurement; and calculate each phase value by subtracting the minimum voltage from the minimum current, taking the absolute value of the difference and multiplying the absolute value by the frequency $f_k$ of the sinusoidal with ripple voltage times 360 degrees.

In an aspect, the rechargeable battery 110 is one of a lithium ion battery and a lead-acid battery.

The third embodiment is illustrated with respect to FIG. 1-FIG. 7. The third embodiment describes a method for determining a frequency of a sinusoidal with ripple current which generates a minimum impedance in a rechargeable battery 110. The method includes connecting a first DC voltage source 102 to an H-bridge circuit 106 comprising four transistor switches having gate contacts. The method includes connecting the H-bridge circuit 106 to a positive terminal 112 of the rechargeable battery 110. The method includes connecting a second DC voltage source 108 to the positive terminal 112. The method includes generating, by the first DC voltage source 102 connected to an H-bridge circuit 106, a sinusoidal with ripple current. The method includes injecting the sinusoidal with ripple current into the rechargeable battery 110. The method includes measuring, by an impedance meter 116, an internal impedance of the rechargeable battery 110. The method includes generating, by a microcontroller 118 connected to each gate contact and the impedance meter 116, a set of drive signals which control each transistor switch, wherein the set of drive signals is configured to generate a sinusoidal with ripple current at the output terminal of the H-bridge circuit 106. The method includes identifying, by the microcontroller 118, a frequency of the sinusoidal with ripple current at which the rechargeable battery 110 has a minimum internal impedance by: iteratively incrementing the frequency of the sinusoidal with ripple current by incrementing each previous frequency $f_{k-1}$ by an amount given by: $-\alpha(512/2^N)$, where a is a sign of the phase value, and N is a number of the sign changes in the phase value from k equals one to k equals k−1, where N equals zero at k equals one; measuring, by the impedance meter 116, the internal impedance at each iteration; calculating, by the microcontroller 118, a phase value of the internal impedance at each iteration, comparing the phase value to a phase error, determining when the phase value is less than the phase error threshold, and adjusting the drive signals to generate the sinusoidal with ripple current at the frequency which has the phase value is less than the phase error threshold. The method includes recharging the battery 110 with the sinusoidal with ripple current at the identified frequency.

Figure 8:
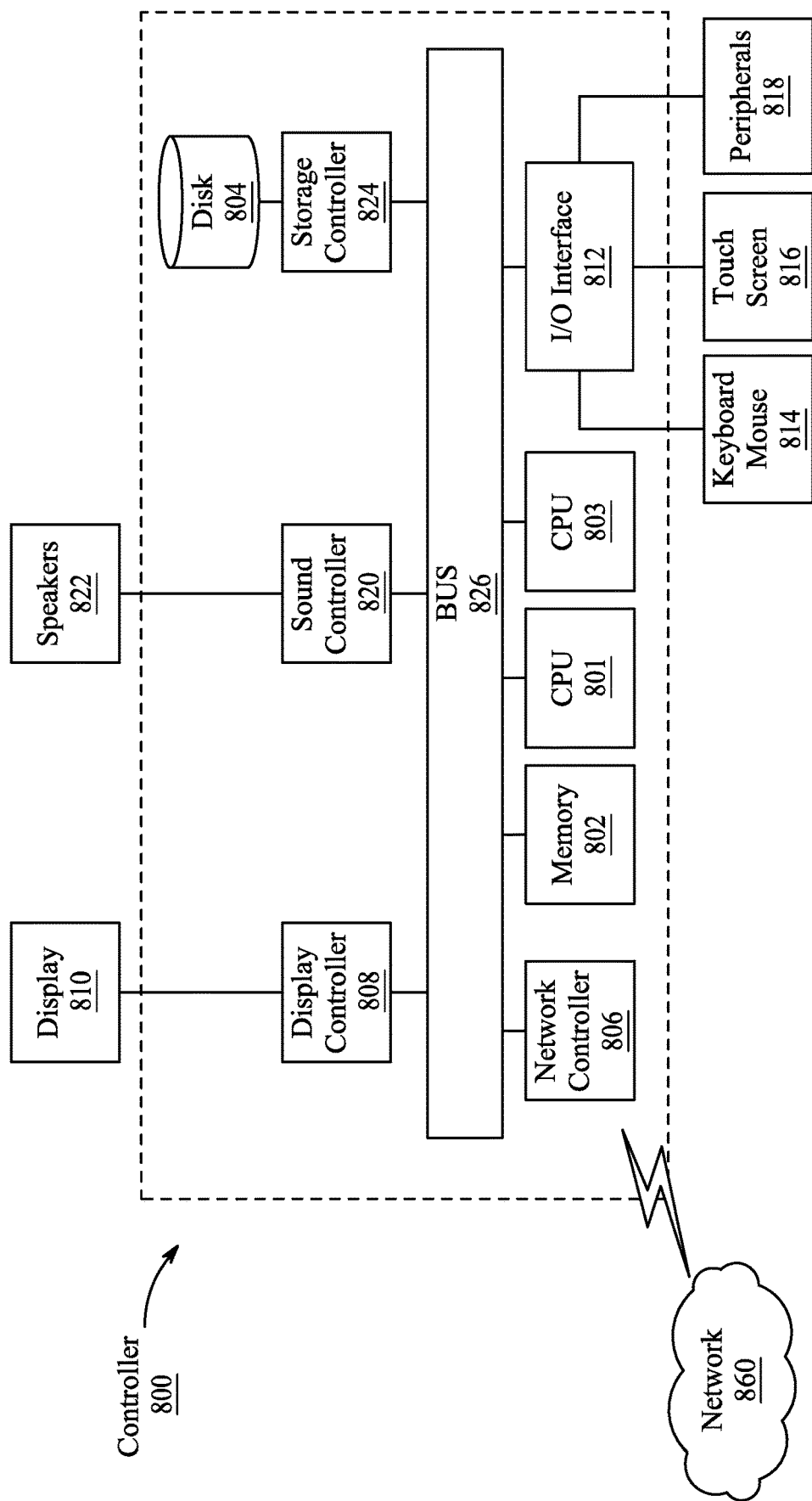
FIG. 8 is an illustration of a non-limiting example of details of computing hardware used in the computing device, according to aspects of the present disclosure.

Next, further details of the hardware description of the computing environment according to exemplary embodiments is described with reference to FIG. 8. In FIG. 8, a controller 800 is described is representative of the amplifier 100 of FIG. 1 in which the controller is a computing device 120 which includes a CPU 801 which performs the processes described above/below. The process data and instructions may be stored in memory 802. These processes and instructions may also be stored on a storage medium disk 804 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 801, 803 and an operating system such as Microsoft Windows 7, Microsoft Windows 10, Microsoft Windows 11, UNIX, Solaris, LINUX, Apple MAC-OS and other systems known to those skilled in the art.

The hardware elements in order to achieve the computing device may be realized by various circuitry elements, known to those skilled in the art. For example, CPU 801 or CPU 803 may be a Xenon or Core processor from Intel of America or an Opteron processor from AMD of America, or may be other processor types that would be recognized by one of ordinary skill in the art. Alternatively, the CPU 801, 803 may be implemented on an FPGA, ASIC, PLD or using discrete logic circuits, as one of ordinary skill in the art would recognize. Further, CPU 801, 803 may be implemented as multiple processors cooperatively working in parallel to perform the instructions of the inventive processes described above.

The computing device in FIG. 8 also includes a network controller 806, such as an Intel Ethernet PRO network interface card from Intel Corporation of America, for interfacing with network 860. As can be appreciated, the network 860 can be a public network, such as the Internet, or a private network such as an LAN or WAN network, or any combination thereof and can also include PSTN or ISDN sub-networks. The network 860 can also be wired, such as an Ethernet network, or can be wireless such as a cellular network including EDGE, 3G, 4G and 5G wireless cellular systems. The wireless network can also be WiFi, Bluetooth, or any other wireless form of communication that is known.

The computing device further includes a display controller 808, such as a NVIDIA GeForce GTX or Quadro graphics adaptor from NVIDIA Corporation of America for interfacing with display 810, such as a Hewlett Packard HPL2445w LCD monitor. A general purpose I/O interface 812 interfaces with a keyboard and/or mouse 814 as well as a touch screen panel 816 on or separate from display 810. General purpose I/O interface also connects to a variety of peripherals 818 including printers and scanners, such as an OfficeJet or DeskJet from Hewlett Packard.

A sound controller 820 is also provided in the computing device such as Sound Blaster X-Fi Titanium from Creative, to interface with speakers/microphone 822 thereby providing sounds and/or music.

The general purpose storage controller 824 connects the storage medium disk 804 with communication bus 826, which may be an ISA, EISA, VESA, PCI, or similar, for interconnecting all of the components of the computing device. A description of the general features and functionality of the display 810, keyboard and/or mouse 814, as well as the display controller 808, storage controller 824, network controller 806, sound controller 820, and general purpose I/O interface 812 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 9.

Figure 9:
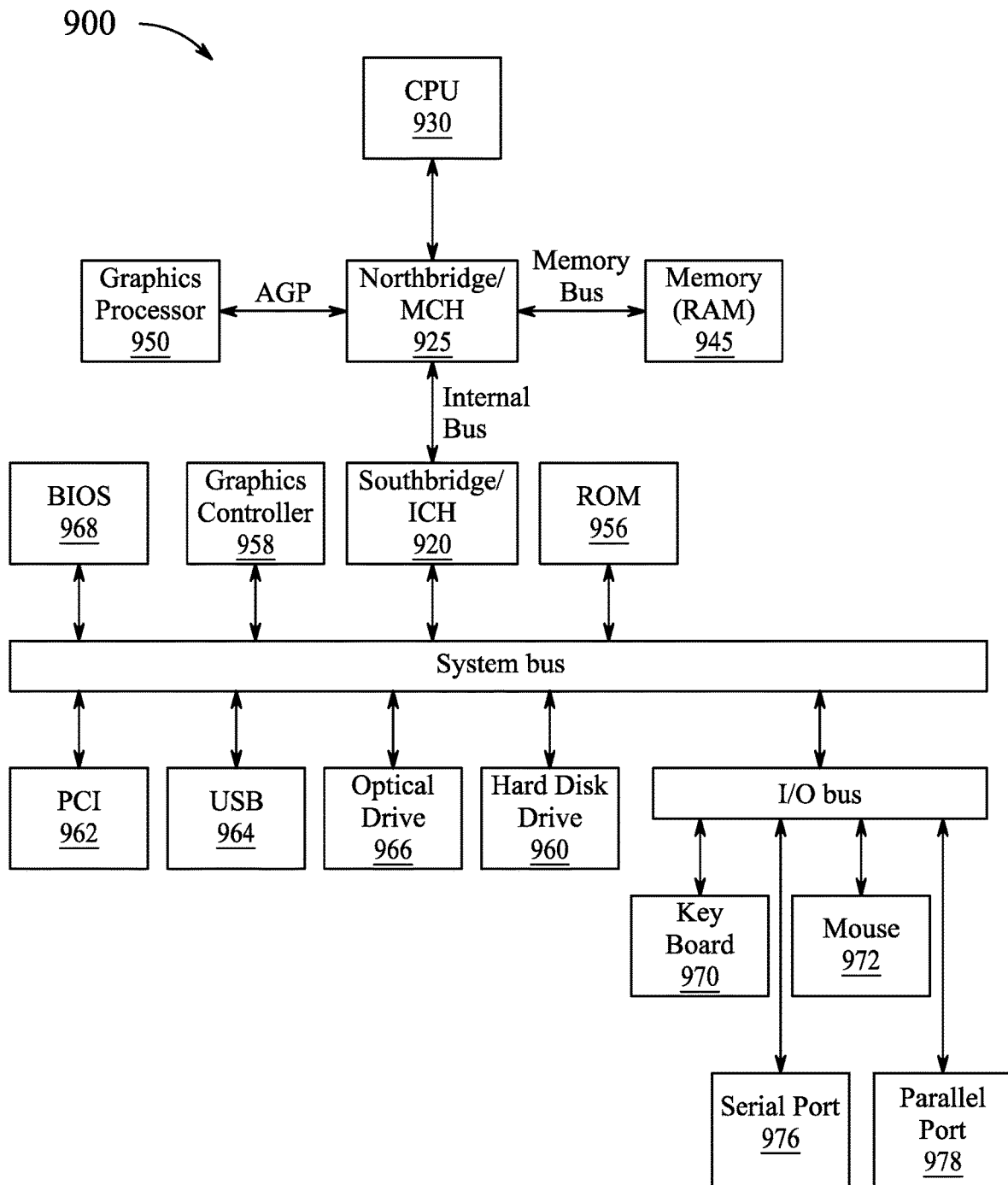
FIG. 9 is an exemplary schematic diagram of a data processing system used within the computing device, according to aspects of the present disclosure.

FIG. 9 shows a schematic diagram of a data processing system, according to certain embodiments, for performing the functions of the exemplary embodiments. The data processing system is an example of a computer in which code or instructions implementing the processes of the illustrative embodiments may be located.

In FIG. 9, data processing system 900 employs a hub architecture including a north bridge and memory controller hub (NB/MCH) 925 and a south bridge and input/output (I/O) controller hub (SB/ICH) 920. The central processing unit (CPU) 930 is connected to NB/MCH 925. The NB/MCH 925 also connects to the memory 945 via a memory bus, and connects to the graphics processor 950 via an accelerated graphics port (AGP). The NB/MCH 925 also connects to the SB/ICH 920 via an internal bus (e.g., a unified media interface or a direct media interface). The CPU Processing unit 930 may contain one or more processors and even may be implemented using one or more heterogeneous processor systems.

Figure 10:
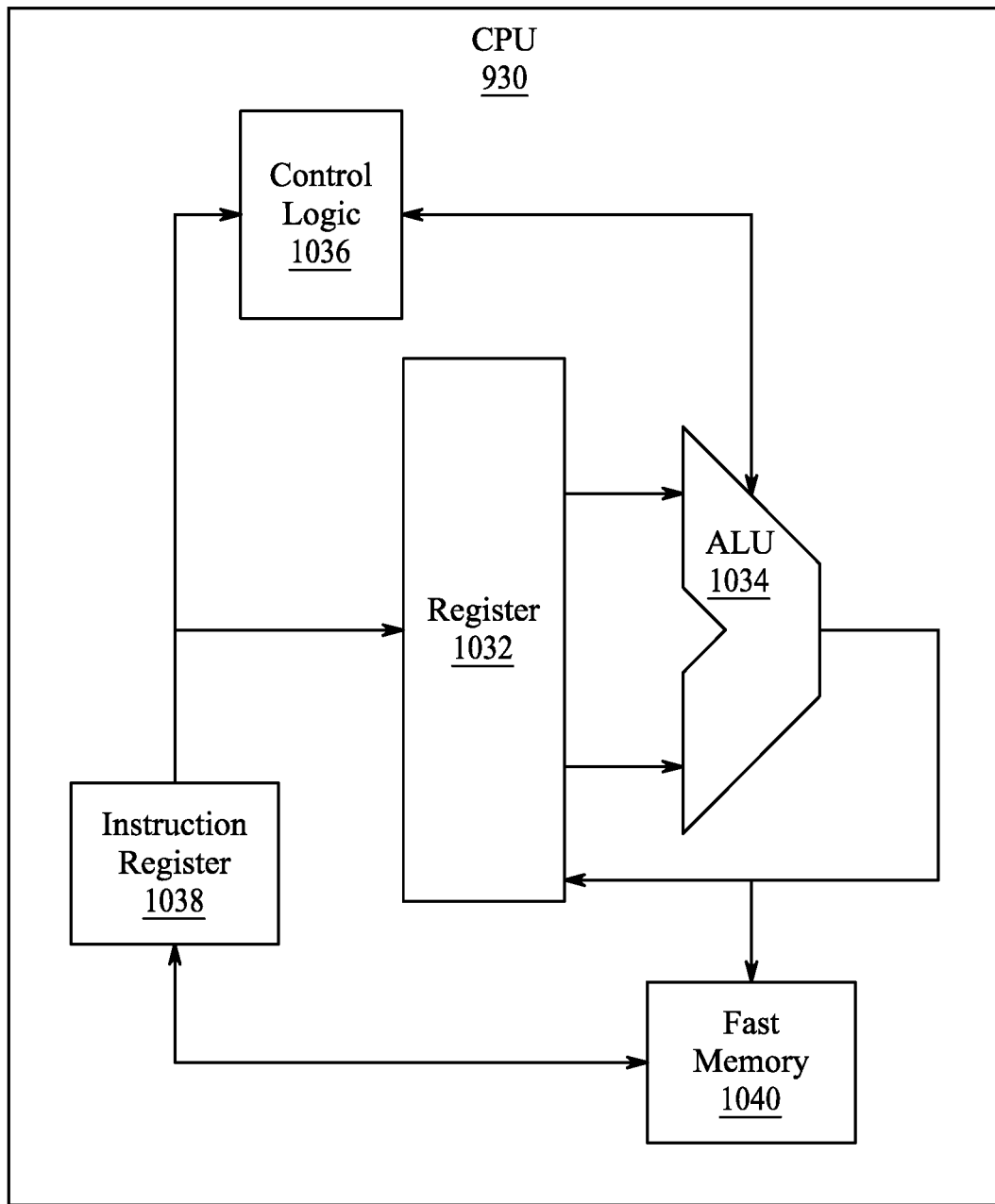
FIG. 10 is an exemplary schematic diagram of a processor used with the computing device, according to aspects of the present disclosure.

For example, FIG. 10 shows one implementation of CPU 930. In one implementation, the instruction register 1038 retrieves instructions from the fast memory 1040. At least part of these instructions are fetched from the instruction register 1038 by the control logic 1036 and interpreted according to the instruction set architecture of the CPU 830. Part of the instructions can also be directed to the register 1032. In one implementation the instructions are decoded according to a hardwired method, and in another implementation the instructions are decoded according to a microprogram that translates instructions into sets of CPU configuration signals that are applied sequentially over multiple clock pulses. After fetching and decoding the instructions, the instructions are executed using the arithmetic logic unit (ALU) 1034 that loads values from the register 1032 and performs logical and mathematical operations on the loaded values according to the instructions. The results from these operations can be feedback into the register and/or stored in the fast memory 1040. According to certain implementations, the instruction set architecture of the CPU 1030 can use a reduced instruction set architecture, a complex instruction set architecture, a vector processor architecture, a very large instruction word architecture. Furthermore, the CPU 930 can be based on the Von Neuman model or the Harvard model. The CPU 930 can be a digital signal processor, an FPGA, an ASIC, a PLA, a PLD, or a CPLD. Further, the CPU 930 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 9, the data processing system 900 can include that the SB/ICH 920 is coupled through a system bus to an I/O Bus, a read only memory (ROM) 956, universal serial bus (USB) port 964, a flash binary input/output system (BIOS) 968, and a graphics controller 958. PCI/PCIe devices can also be coupled to SB/ICH 988 through a PCI bus 962.

The PCI devices may include, for example, Ethernet adapters, add-in cards, and PC cards for notebook computers. The Hard disk drive 960 and CD-ROM 966 can use, for example, an integrated drive electronics (IDE) or serial advanced technology attachment (SATA) interface. In one implementation the I/O bus can include a super I/O (SIO) device.

Further, the hard disk drive (HDD) 960 and optical drive 966 can also be coupled to the SB/ICH 920 through a system bus. In one implementation, a keyboard 970, a mouse 972, a parallel port 978, and a serial port 976 can be connected to the system bus through the I/O bus. Other peripherals and devices that can be connected to the SB/ICH 920 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

Figure 11:
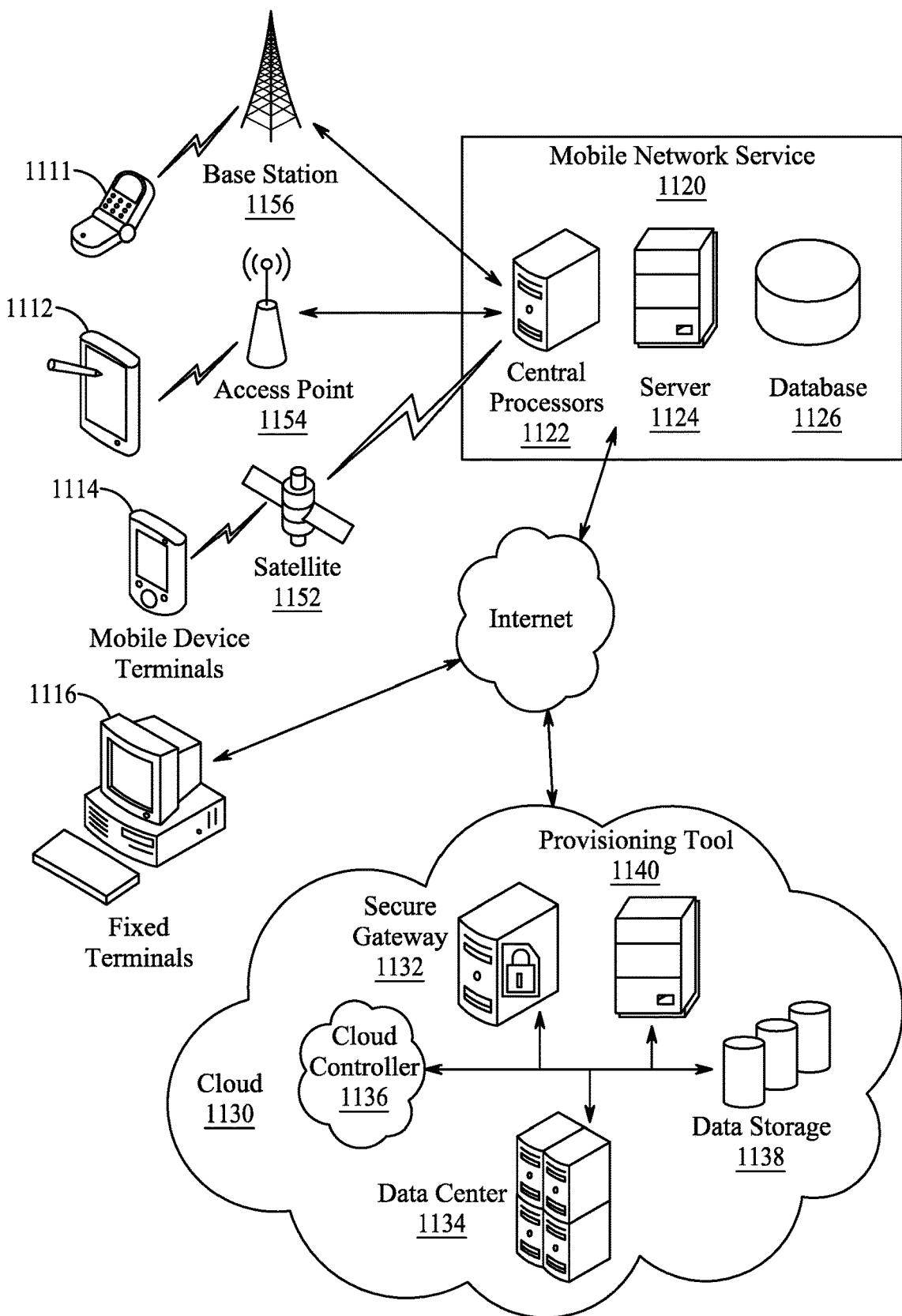
FIG. 11 is an illustration of a non-limiting example of distributed components which may share processing with the controller, according to aspects of the present disclosure.

The functions and features described herein may also be executed by various distributed components of a system. For example, one or more processors may execute these system functions, wherein the processors are distributed across multiple components communicating in a network. The distributed components may include one or more client and server machines, which may share processing, as shown by FIG. 10, in addition to various human interface and communication devices (e.g., display monitors, smart phones, tablets, personal digital assistants (PDAs)). More specifically, FIG. 11 illustrates client devices including smart phone 1111, tablet 1112, mobile device terminal 1114 and fixed terminals 1116. These client devices may be commutatively coupled with a mobile network service 1120 via base station 1156, access point 1154, satellite 1152 or via an internet connection. Mobile network service 1120 may comprise central processors 1122, server 1124, and database 1126. Fixed terminals 1116 and mobile network service 1120 may be commutatively coupled via an internet connection to functions in cloud 1130 that may comprise security gateway 1132, data center 1134, cloud controller 1136, data storage 1138 and provisioning tool 1140. The network may be a private network, such as a LAN or WAN, or may be a public network, such as the Internet. Input to the system may be received via direct user input and received remotely either in real-time or as a batch process. Additionally, some aspects of the present disclosures may be performed on modules or hardware not identical to those described. Accordingly, other aspects of the present disclosures are within the scope that may be claimed.

The above-described hardware description is a non-limiting example of corresponding structure for performing the functionality described herein.

Numerous modifications and variations of the present disclosure are possible in light of the above teachings. It is therefore to be understood that within the scope of the appended claims, the invention may be practiced otherwise than as specifically described herein.

The invention claimed is:

1. A method for recharging a vehicle battery, comprising:
connecting a first DC voltage source to an input terminal of an H-bridge circuit, wherein the H-bridge circuit comprises four transistor switches, wherein each transistor switch includes a gate contact;
connecting a microcontroller to the gate contacts of each of the four transistor switches;
connecting an output terminal of the H-bridge circuit to a positive terminal of a rechargeable battery of a vehicle;
connecting a second DC voltage source to the positive terminal of the rechargeable battery, wherein the second DC voltage source is a lead battery;
generating, by the microcontroller, drive signals configured to control the four transistor switches;
transmitting the drive signals to the gates of each of the four transistor switches, wherein the drive signals cause the H-bridge circuit to form a sinusoidal with ripple current at the output terminal of the H-bridge circuit;
measuring, by an impedance meter connected to the microcontroller, an internal impedance of the rechargeable battery, wherein the impedance meter is connected to a negative terminal of the rechargeable battery;
performing, by the microcontroller, an autosearch algorithm to identify a frequency of the sinusoidal with ripple current at which the rechargeable battery has a minimum internal impedance by iteratively incrementing the frequency by a frequency step size which has an initial large value which is decreased after each iteration by dividing the frequency step size by two;
after each iteration, measuring, by the impedance meter, the internal impedance of the battery;
calculating, by the microcontroller, a phase value of the internal impedance after each iteration;
comparing the phase value at each step of the iteration to a phase error threshold $\varepsilon$;
when the phase value is less than the phase error threshold $\varepsilon$, identifying, by the microcontroller, the frequency as a minimum frequency at which an imaginary part of the battery impedance is zero;
measuring, by the impedance meter, a phase of a voltage at the input terminal of the battery and a phase of a current between the output terminal of the H-bridge and the input terminal of the battery at each iteration;
calculating, by the microcontroller, a phase difference between the phase of the current and the phase of the voltage;
comparing the phase difference to the phase error threshold $\varepsilon$;
when the phase difference is greater than the phase error threshold $\varepsilon$, iteratively incrementing the frequency by incrementing a previous frequency $f_{k-1}$ by an amount given by: $-\alpha(512/2^N)$, where $\alpha$ is a sign of the phase difference, and N is a number of the sign changes in the phase difference from k equals one to k equals k−1, where k equals an iteration number, where N equals zero at k equals one until the phase difference is less than the phase error threshold $\varepsilon$;
identifying, by the microcontroller, the frequency as a minimum frequency at which an imaginary part of the battery impedance is zero;
adjusting, by the microcontroller, the drive signals to generate the sinusoidal with ripple current at the minimum frequency;
transmitting, by the microcontroller, the adjusted drive signals to the gates of each of the four transistor switches;
injecting the sinusoidal with ripple current at the minimum frequency into the rechargeable battery; and
recharging the battery with the sinusoidal with ripple current at the minimum frequency.

2. The method of claim 1, further comprising:
identifying the frequency of the sinusoidal with ripple current at which the rechargeable battery has minimum internal impedance by:
injecting a first frequency of the sinusoidal with ripple current into the rechargeable battery;

measuring, by the impedance meter, a first impedance of the rechargeable battery;

calculating, by the microcontroller, a phase value of the first impedance;

incrementing the first frequency;

measuring, by the impedance meter, a second impedance of the rechargeable battery;

measuring, by the microcontroller, a phase value of the second impedance; and continuing to increment, by the microcontroller, each previous frequency $f_{k-1}$, wherein k is an iteration number, and measure the impedance and the phase value until the phase value of the impedance is less than the phase error threshold $\varepsilon$.

3. The method of claim 2, wherein the phase error threshold $\varepsilon$ is 0.1 degrees.

4. The method of claim 2, further comprising:

measuring, with the impedance meter, for each iteration k, the current between the output terminal of the H-bridge and the input terminal and the voltage at the input terminal of the battery;

identifying, by the microcontroller, for each iteration k, a phase of the current between the output terminal of the H-bridge and the input terminal and a phase of the voltage at the input terminal of the battery; and calculating, by the microcontroller, each phase value by subtracting the phase of the voltage at the input terminal of the battery from the phase of the current between the output terminal of the H-bridge and the input terminal, taking the absolute value of the difference between the phase of the voltage at the input terminal of the battery and the phase of the current between the output terminal of the H-bridge and the input terminal and multiplying the absolute value of the difference by the frequency $f_k$, for each iteration number k of the sinusoidal with ripple voltage by 360 degrees.

5. The method of claim 2, wherein the first frequency is 100 Hz.

6. The method of claim 2, wherein the first frequency is selected from the range consisting of 100 Hz to 500 Hz.

7. The method of claim 6, wherein each iteration of the frequency equals a previous iteration of the frequency plus $-\alpha \times 256$ kHz, wherein $\alpha$ is +1 if the impedance is capacitive and $\alpha$ is −1 if the impedance is inductive.

* * * * *